United States Patent [19]
Nakagawa et al.

[11] Patent Number: 4,851,302
[45] Date of Patent: Jul. 25, 1989

[54] FUNCTIONAL ZNSE:H DEPOSITED FILMS

[75] Inventors: Katsumi Nakagawa, Nagahama; Shunichi Ishihara; Kozo Arao, both of Hikone; Yasushi Fujioka; Akira Sakai, both of Nagahama; Masahiro Kanai, Tokyo, all of Japan

[73] Assignee: Canon Kabushiki Kaisha, Tokyo, Japan

[21] Appl. No.: 221,761

[22] Filed: Jul. 20, 1988

[30] Foreign Application Priority Data

Jul. 21, 1987 [JP] Japan ................................ 62-179926

[51] Int. Cl.[4] .................... H01L 21/265; H01L 21/363
[52] U.S. Cl. .................................... 428/658; 136/264; 136/265; 148/DIG. 1; 357/2; 357/61; 357/63; 428/620; 437/24; 437/105; 437/106
[58] Field of Search .................... 437/105, 106, 22, 24; 420/579; 148/DIG. 1; 357/2, 63, 61; 136/264, 265; 428/620, 658

[56] References Cited
U.S. PATENT DOCUMENTS

| | | | |
|---|---|---|---|
| 3,670,220 | 6/1972 | Kun et al. | 437/185 |
| 3,755,002 | 8/1973 | Hirai et al. | 148/DIG. 64 |
| 4,217,374 | 8/1980 | Ovshinsky et al. | 437/170 |
| 4,632,711 | 12/1986 | Fujita et al. | 437/105 |
| 4,735,910 | 4/1988 | Mitsuyu et al. | 437/105 |
| 4,795,501 | 1/1989 | Stanbery | 437/2 |

Primary Examiner—Upendra Roy
Attorney, Agent, or Firm—Fitzpatrick, Cella, Harper & Scinto

[57] ABSTRACT

There is provided a functional ZnSe:H deposited film composed of zinc atoms, selenium atoms, and at least hydrogen atoms, with the content of hydrogen atoms being 1 to 4 atomic % and the ratio of crystal grains per unit volume being 65 to 85 vol %. It is capable of efficient doping and is stable to irradiation. It can be made into a high conductivity p-type of n-type ZnSe:H:M film by doping. It can be efficiently deposited on a non-single crystal substrate such as metal, glass, and synthetic resin which was incapable of efficient depositing. Thus the invention makes it possible to form a high-functional device such as a photovoltaic element of ZnSe film on a non-single crystal substrate.

3 Claims, 10 Drawing Sheets

FUNCTIONAL ZNSE:H DEPOSITED FILMS

FIELD OF THE INVENTION

The present invention relates to a functional deposited film which is composed of zinc atoms and selenium atoms and at least hydrogen atoms. More particulary, it is concerned with an improved functional deposited film having p-type conductivity which is suitable for use not only in solar cell but also in other electronic devices.

BACKGROUND OF THE INVENTION

There have been proposed a variety of photovoltaic elements such as solar cell and power source for commercial and home appliances. They utilize the pn junction formed by ion implantation or thermal diffusion of impurities into a substrate of single crystal of silicon (Si) or gallium arsenide (GaAs), or by epitaxial growth of an impurity-doped layer on a substrate of such single crystal. However, there is a disadvantage for these photovoltaic elements that their production cost unavoidably becomes costly because of using a single crystal substrate. Because of this, they have not yet gained general acceptance for use as solar cell or as power source in commercial and home appliances.

Recently, there has been proposed a photovoltaic element in which there is utilized pin junction of amorphous silicon (hereinafter referred to as "A-Si") deposited film formed on an inexpensive substrate of non-single crystal material such as glass, metal, ceramics, and synthetic resin by way of the glow discharge decomposition method. This photovoltaic element has a nearly satisfactory performance and is of low production cost and because of this, it has been recognized usable as power source for some kinds of appliances such as electronic calculators and wrist watches.

However, for this photovoltaic element, there is a disadvantage that the output voltage is low because the band gap of the A-Si film constituting the element is 1.7 eV, which is not large enough. There is another disadvantage that its photoelectric conversion efficiency is low for a light source such as fluorescent light which contains more short-wavelength light, so that its application is limited to appliances with very small power consumption.

There is a further disadvantage for said photovoltaic element that the constituent A-Si film is often accompanied with a character of the so-called Staebler-Wronsk, effect, with which the film being deteriorated upon continuous irradiation with intense light for a long period of time. In view of the above, the foregoing proposed photovoltaic element is not practical for use as a power solar cell for which it is required to stably and continuously exhibit the desired characteristics over a long period of time.

On the other hand, there have been proposed direct transition-type semiconductor films having a wide band gap, such as ZnSe (having a band gap of 2.67 eV) and ZnTe (having a band gap of 2.26 eV) and mixed crystal thereof $ZnSe_{1-x}Te_x$ (where $0<x<1$). And the public attention has been forcused on these semiconductor films. These semiconductor films are, in general, such that are formed on a substrate of single crystal by way of epitaxial growth. The as-grown film of ZnSe exhibits the n-type conductivity and the as-grown film of ZnTe exhibits the p-type conductivity. However for any of these films, it is generally recognized that it is difficult for the film to be controlled to the reverse conductivity. Further, in order to carry out the epitaxial growth upon the film formation, it is required to use a specific substrate of single crystal and to maintain the substrate at elevated temperature. And in this film formation, the deposition rate is low. Because of this, it is impossible to perform epitaxial growth on a commercially available substrate which is inexpensive and low heat-resistant such as glass and synthetic resin. These factors make it difficult to develop practically applicable semiconductor films using the foregoing commercially available substrates.

Even in the case where a semiconductor film should be fortunately formed on such commercially available substrate, the film will be such that is usable only in very limited applications.

In fact, there have been various proposals to form a direct transition-type semiconductor film on a non-single crystal substrate such as glass, metal, ceramics and synthetic resin. However, under any of such proposals, it is difficult to obtain a desired direct transition-type semiconductor film having satisfactory electrical characteristics because the resulting film becomes to be accompanied with defects of various kinds which make the film poor in electrical characteristics and on account of this, it is difficult for the film to be controlled with the film by doping it with an impurity.

In the meantime, amorphous film composed of Zn and Se elements is described in U.S. Pat. No. 4,217,374 (called "literature 1" hereinafter) and also in U.S. Pat. No. 4,226,898 (called "literature 2" hereinafter). And ZnSe compound is described in Japanese Patent Laid-open No. 189649/1986 (called "literature 3" hereinafter) and Japanese Patent Laid-open No. 189650/1986 (called "literature 4" hereinafter).

Now, literature 1 discloses amorphous semiconductor films containing selenium (Se), zinc (Zn), hydrogen (H) and lithium (Li); but the subject lies in amorphous selenium, semiconductor films and the Zn described therein is merely an additive as well as Li and H. And as for the Zn and the Li, likewise in the case of the H, they are used aiming at reduction of the local state density in the energy gap without changing the inherent characteristics of the film. In other words, the addition of Zn to the amorphous Se film mentioned in literature 1 is not intended to positively form a ZnSe compound. Incidentally, literature 1 mentions nothing about the ZnSe compound and the formation of ZnSe crystal grains. Regarding the addition of Li, it should be noted that it is not added as a dopant.

Literature 2 does mention amorphous semiconductor films containing Se, Zn, and H. However, it deals mainly with amorphous silicon, and it defines Se as an element to form a compound with said silicon. As for the Zn, it defines as an element to sensitize the photoconductivity and reduce the local state density in the energy gap. In other words, the additions of Zn and Se are not intended to form a ZnSe compound. Incidentally, literature 2 mentions nothing about the ZnSe compound and the formation of ZnSe crystal grains.

Literature 3 and literature 4 are concerned with the deposition of a ZnSe film by HR-CVD method (hydrogen radical assisted CVD method). That is, they disclose methods of improving the deposition rate and the productivity of a deposited film; but they merely mention deposited films of non-doped ZnSe.

Against these backgrounds, there is an increased social demand to provide an inexpensive photovoltaic element having a high photoelectric conversion efficiency which may be practically usable as solar cell and also as a power source in various appliances.

SUMMARY OF THE INVENTION

The present invention is aimed at solving the aforementioned problems relating to photovoltaic elements for use in solar cell and other appliances and satisfying the foregoing social demand.

It is therefore an object of the present invention is to provide a functional deposited film containing zinc atoms and selenium atoms as the main constituents, and at least hydrogen atoms which is excellent in quality and which can be formed even on a commercially available non-single crystal substrate of glass, metal, ceramics or synthetic resin.

Another object of the present invention is to provide said functional deposited film the conductivity of which may be stably and easily controlled by doping with a proper impurity and which is highly sensitive to the doping.

A further object of the present invention is to provide the foregoing functional deposited film which enables one to produce a desirable photovoltaic element having an improved photoelectric conversion efficiency which is suited for use in solar cell and in other appliances.

DETAILED DESCRIPTION OF THE INVENTION

The present inventors have made extensive studies for overcoming the foregoing problems on the known ZnSe film for use in various appliances such as solar cell and attaining the objects as described above and as a result, have accomplished the present invention based on the findings as below described.

That is, as a result that there was prepared a ZnSe deposited amorphous film in which a specific amount of hydrogen atoms being incorporated and the proportion of crystal grains per unit volume being controlled to a specific value (this deposited film is hereinafter referred to as "ZnSe:H film"), the present inventor have found the facts that (a) the ZnSe:H film may be formed in a desired state even on a non-single crystal substrate of glass, metal, ceramics or synthetic resin: (b) the ZnSe:H film formed on such non-single crystal substrate is accompanied with very few defects: (c) it can be easily and efficiently doped with a dopant of p-type or n-type: and (d) when doped with a p-type dopant, it becomes a desirable p-type ZnSe:H semiconductor film.

The present invention has been completed on the basis of these findings. The gist of the present invention therefore resides in a functional deposited film composed of zinc atoms, selenium atoms and at least hydrogen atoms, characterized in that the content of the hydrogen atoms is in the range from 1 to 4 atomic % and the proportion of crystal grains per unit volume is in the range from 65 to 85 vol %.

The experiments which were carried out by the present inventors to obtain the foregoing findings will be explained in the following.

Experiment A: Investigation on the ratio of crystal grain domain formed when hydrogen atoms are introduced into the ZnSe film (1) Preparation of samples (i) There were provided two kinds of substrates. That is, one substrate is a round silicon wafer, 0.5 mm thick and 1 inch diameter (resistivity ($\rho$)=about $10^{-1}$ $\Omega$-cm), on which is formed an $SiO_2$ film of about 5000 Å in thickness by way of conventional thermal oxidation treatment in an oxygen gas stream at 1000° C. The other substrate is a square quartz glass measuring 2.5 cm by 2.5 cm.

Figure 2:
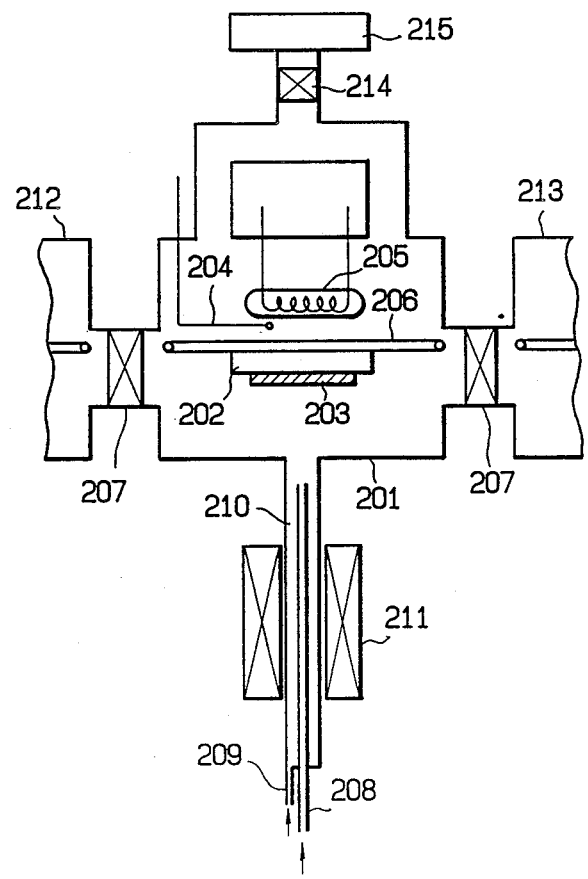
FIG. 2 is a schematic diagram showing a apparatus for forming a functional deposited film which is suitable for practicing the later described process (1) of the present invention.

(ii) The above-mentioned two substrates were placed side by side on the substrate holder 202 of the known apparatus as shown in FIG. 2. On the respective substrates were formed a ZnSe:H film under the conditions shown in Table 1. Thus, there were obtained Samples Nos. 1-12 and Samples Nos. 1'-12'.

(iii) Each of Samples Nos. 1-12 (deposited on silicon wafers) was cut in half. Each of the cut halves was cut to a 5 mm square size which matches the holder of a transmission electron microscope (TEM). The cut piece was fixed to a glass plate, measuring 50 mm by 50 mm and 1 mm thick, by the aid of wax, with the deposited film in contact with the glass surface so that the deposited film was visible through the opposite side of the glass plate.

(iv) The exposed part (silicon single crystal wafer) of the sample as prepared in (iii) was etched with an aqueous solution of HF, $HNO_3$, and $CH_3COO$. The etching rate was properly controlled by changing the concentration of HF in the etching solution. Etching was continued until the silicon single crystal wafer was completely removed. The progress of etching was confirmed by observing the light passing through the deposited film.

(v) After etching, the wax was removed by the aid of an organic solvent (toluene), and the deposited film was separated from the glass plate, followed by rinsing and air drying. Thus there was obtained a film specimen composed of an $SiO_2$ film and a ZnSe:H film.

(2) Examination of the film specimen prepared in (1)

Each film specimen of Samples Nos. 1–12 formed on silicon wafers in step (1) was examined by means of a TEM (with an acceleration voltage of 200 keV). The transmission image contained a lattice image with very few lattice defects in that part of the ZnSe:H film where the crystal grain domain exists. It was found that the lattice image are uniformly distributed throughout the ZnSe:H film.

The lattice image was utilized to estimate the number of crystal grain domains present in a certain area of the film specimen. Thus the ratio in terms of vol % of the crystal grain domain in the deposited film was calculated.

For the purpose of reference, the direction of the crystal grain and the size of the crystal grain domain were measured by the aid of X-ray diffraction.

(3) Determination of hydrogen in the deposited film (i) Each of Samples Nos. 1'–12' deposited on quartz substrates in the above-mentioned step (1)-(i) was cut in half. Each of the cut halves was placed in a vacuum chamber and heated therein from room temperature to 1000° C. During the heating period, the amount of hydrogen (H) released from the specimen was determined by means of a mass spectrometer. The resulting data were compared with those of the standard sample prepared by implanting a known amount of hydrogen into a hydrogen-free sample.

(ii) Each deposited film of Samples Nos. 1–12 used for TEM observation was examined for the distribution of Zn atoms and Se atoms by the aid of an X-ray microanalyzer ("XMA" for short), made by Shimazu Seisakusho Ltd., and was also subjected to elemental analysis. The results are shown in Table 2.

The data obtained from all of Samples Nos. 1–12 indicate that Zn atoms and Se atoms are uniformly distributed in the deposited film and Zn atoms and Se atoms constitute the deposited film at a stoichiometric ratio close to 1:1.

(4) Results

The results of the measurements in steps (2) and (3) mentioned above are graphically represented in FIG. 5. It is noted from FIG. 5 that as the content (atomic %) of hydrogen atoms (H) in the ZnSe:H film increases, the ratio of the crystal grain domain per unit volume in the deposited film decreases. With the content of hydrogen atoms in the range of 0.1 to 10 atomic %, the ratio of crystal grain domain per unit volume in the film is 90 to 40 vol %.

In the sample preparation step (1) mentioned above, the flow rate of hydrogen gas should be properly controlled. With a flow rate lower than 0.05 sccm, the deposited film is composed mainly of Zn; and with a flow rate in excess of 2 slm, no film is deposited.

Experiment B: Investigation on the relation between the electrical characteristics of the deposited film and the content of hydrogen atoms in the deposited film and also the ratio of crystal grain domain per unit volume in the deposited film The deposited film formed on the quartz substrate in step (1)-(ii) mentioned above was examined for dark conductivity. The experiment was carried out using the remaining cut halves of samples Nos. 1'~12'. Prior to measurements, a comb-shaped aluminum electrode was formed on the specimen by vacuum deposition. The results are shown in FIG. 6.

Figure 6:
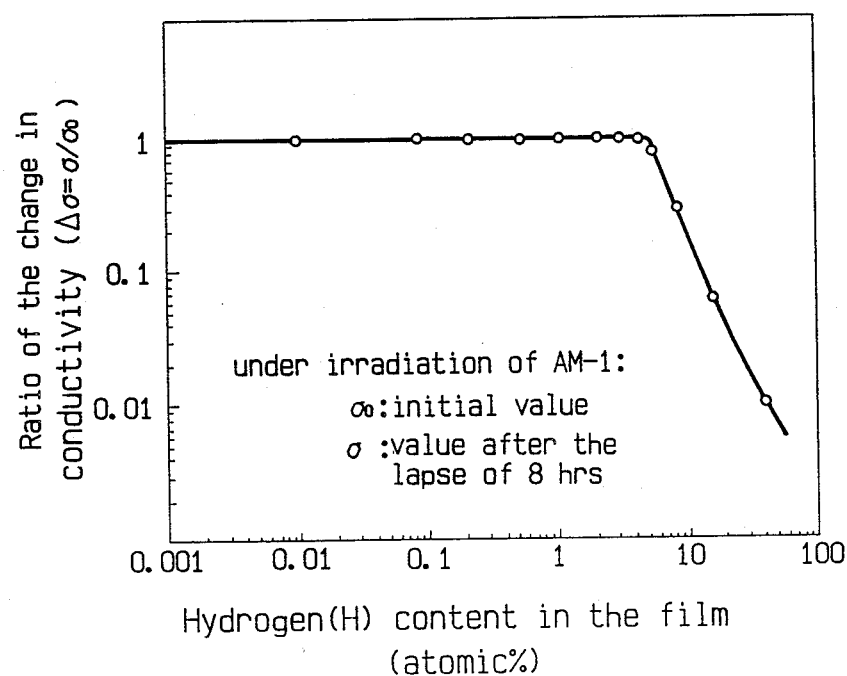
FIG. 6 is a graph showing the inter relations between the contents of hydrogen (H) and the conductivities on deposited films in the below-mentioned Experiment B.

It is noted from FIG. 6 that the change of dark conductivity ($\sigma$) which occurs after irradiation with AM-1 for 8 hours varies depending on the content of hydrogen atoms (H) in the film. With 4 atomic % or less, almost no change occurs, and with 8 atomic % and above, a significant change occurs. (The ratio of change $\Delta\sigma$ is expressed by $\sigma/\sigma_0$, where $\sigma_0$ is an initial value and $\sigma$ is a value measured after irradiation for 8 hours.)

The relation between the drift mobility of holes and the hydrogen content in the deposited film was investigated using the remaining cut halves of samples Nos. 1~12 prepared in step (1)-(ii) mentioned above. (The ZnSe:H film was deposited on an $SiO_2$ film formed on an Si-wafer.) Prior to measurements, each specimen was provided with an aluminum semitransparent film by vacuum deposition. The specimen was irradiated with UV light pulses (about 1 nsec) while a pulse voltage was being applied across the aluminum film and the silicon wafer, with the aluminum film being negative. The drift mobility was measured by the time-of-flight method. The results are shown in FIG. 7.

Figure 7:
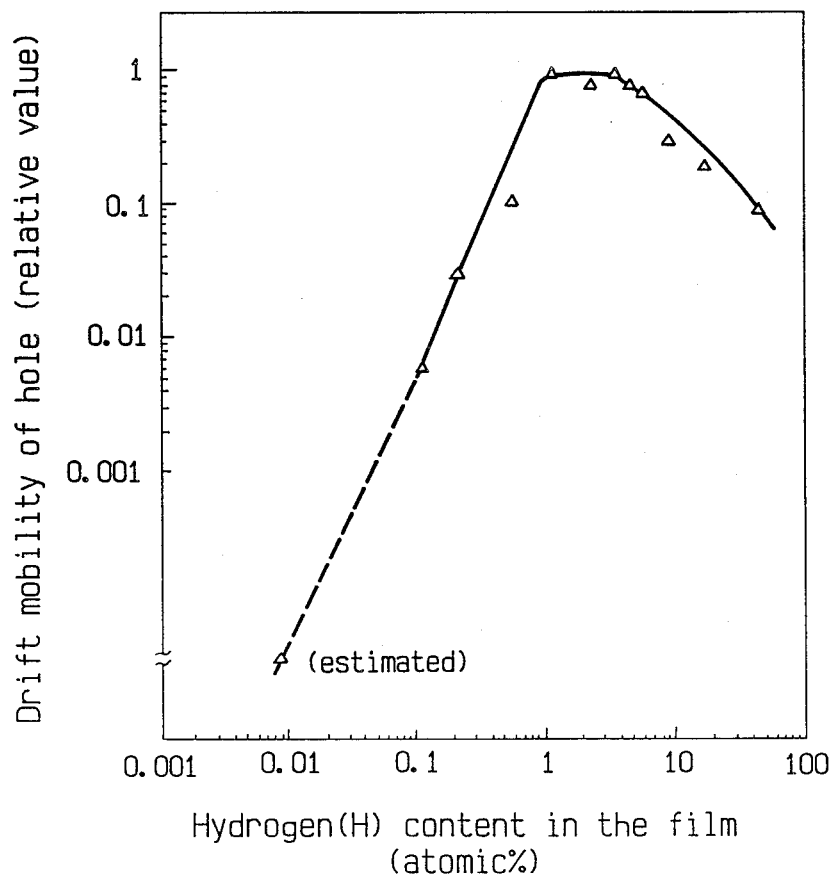
FIG. 7 is a graph showing the inter relations between the contents of hydrogen (H) and the drift mobilities of hole on deposited films in the below-mentioned Experiment B.

The following is noted from FIG. 7. With a hydrogen content less than 0.5 atomic %, the drift mobility of holes is very small. With a hydrogen content in the range of 1 to 8 atomic %, the drift mobility of holes is very high. With a hydrogen content in excess of 8 atomic %, the drift mobility of holes gradually decreases.

The above-mentioned results suggest that the content of hydrogen atoms in the deposited film should be 8 atomic % or less, preferably 4 atomic % or less, from the standpoint of change in characteristics induced by the irradiation of light, and 0.5 atomic % or more, preferably 1 atomic % of more, from the standpoint of the mobility of holes.

Figure 5:
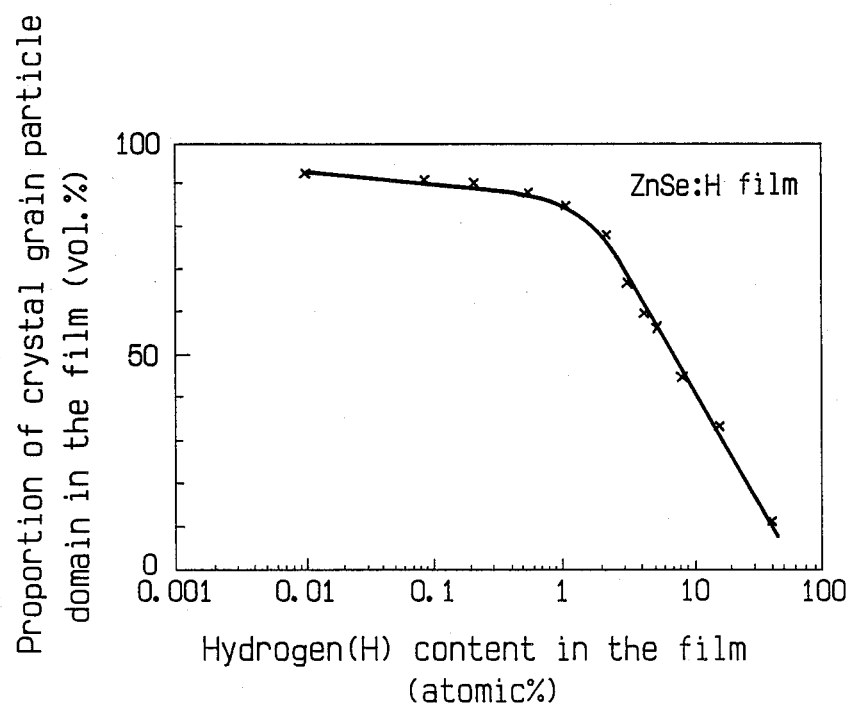
FIG. 5 is a graph showing the inter relations of measured results for the ratios of crystal grain domains and for the contents of hydrogen (H) on films deposited on silicon wafers and quartz substrates in which data are from the below-mentioned Experiments A(2) and A(3).

According to FIG. 5, the ratio of the crystal grain domain per unit volume in the ZnSe:H deposited film is in the range of 65 to 85 vol % if the deposited film contains 1 to 4 atomic % of hydrogen atoms.

It is concluded from the foregoing that the electrical characteristics of the ZnSe:H deposited film depend largely on the content of hydrogen atoms (H) in the film and also on the ratio of crystal grain domain per unit volume in the film. For example, if the deposited film is to have the electrical characteristics suitable for use as solar cells or similar devices, the hydrogen content should be in the range of 1 to 4 atomic % and the ratio of crystal grain domain should be in the range of 65 to 85 vol %.

Experiment C: Investigation on the relation between the doping characteristics of the deposited film and the content of hydrogen atoms in the deposited film and also the ratio of crystal grain domain per unit volume in the deposited film (1) The procedure of Experiment A was repeated, except that $LiC_3H_7$ ($1.0 \times 10^{-10}$ mol/min) was added to the raw material gas (A), to form a ZnSe:H:Li film on a silicon wafer (with an $SiO_2$ film formed thereon) and a quartz glass substrate. Thus there were obtained samples Nos. 13~24 and samples Nos. 13'~24'.

(2) Each of samples Nos. 13'~24' (deposited on quartz glass substrates) was cut in half. One half was used for the measurement of dark conductivity after the formation of a comb-shaped aluminum electrode by vacuum deposition. The other half was used for the measurement of hydrogen content in the same manner as in Experiment A mentioned above.

Figure 8:
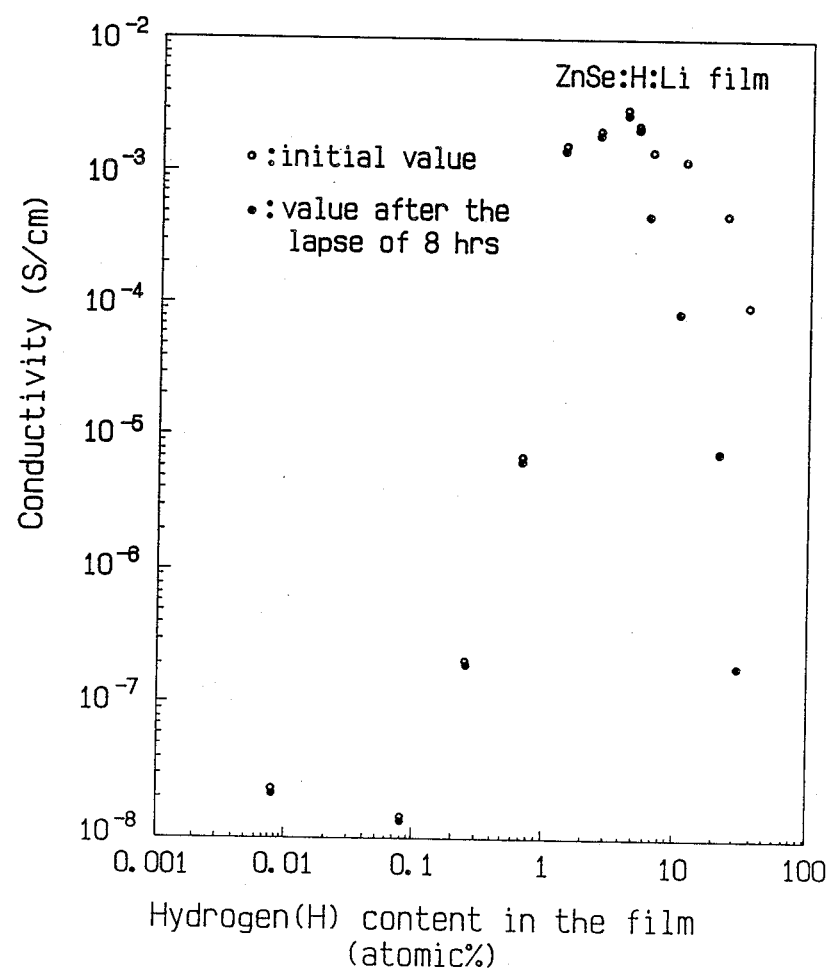
FIG. 8 is a graph showing the inter relation between the contents of hydrogen (H) and the dark conductivities on deposited films in the below-mentioned Experiment C.

The results of measurements are shown in FIG. 8. In the figure, white circles (◯) represent the dark conductivity of the ZnSe:H:Li film which was not irradiated with light more intense than the room light. Black circles (●) represent the dark conductivity of the ZnSe:H:Li film which was measured after continuous irradiation with AM-1 (100 mW/cm$^2$) for 8 hours.

The specimens, with a comb-shaped aluminum electrode formed thereon by vacuum deposition, were examined for conductivity type by the aid of thermoelectromotive force. It was found that they exhibit the p-type conductivity if they contain more than 0.25 atomic % of hydrogen, and they exhibit the weak n-type conductivity if they contain less than 0.08 atomic % of hydrogen.

Figure 9:
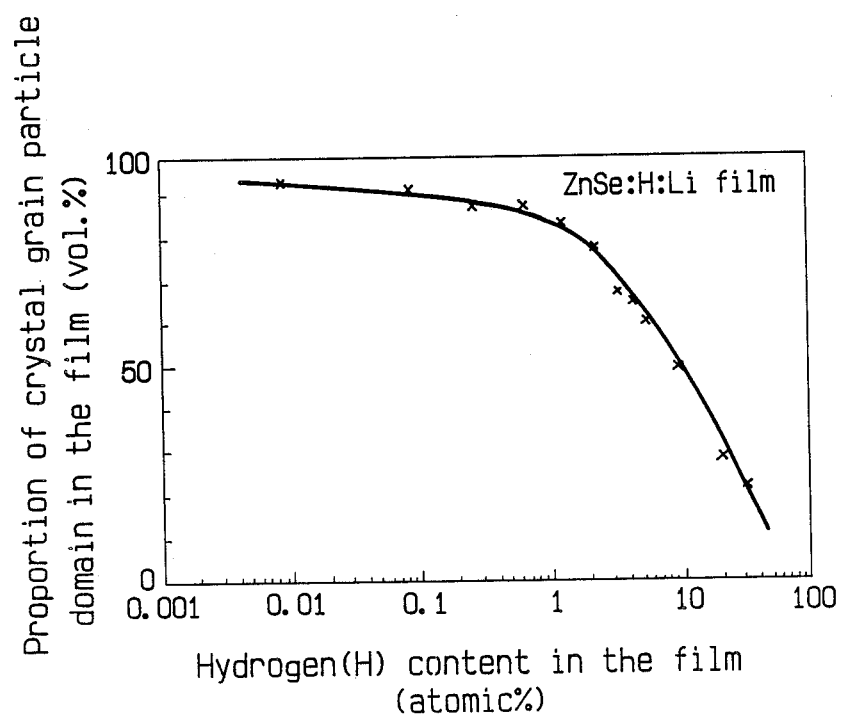
FIG. 9 is a graph showing the inter relations between the contents of hydrogen (H) and the ratios of crystal grain domains on deposited films in the below-mentioned Experiment C.

(3) Samples Nos. 13~24 were examined for the ratio of crystal grain domain per unit volume in the film according to the same procedure as in Experiment A mentioned above. The results are shown in FIG. 9. The relation between the ratio of crystal grain domain per unit volume in the film and content of hydrogen atoms in the film is almost identical with that of an undoped film.

(4) It is noted from FIGS. 8 and 9 that the film that can be doped efficiency contains more than 15 vol % of non-crystal grain domain. In other words, for the film to be doped efficiently, it is necessary that the film contain more than 15 vol % of non-crystal grain domain.

The foregoing suggests that the deposited film should contain a certain amount of non-crystal grains. With too small an amount of non-crystal grains, the deposited film lacks the flexible structure. Insufficient structural relief at the crystal grain boundaries lead to defects such as dangling bond. When a film of such structure is doped, the dopant does not enter the crystal grains but collects at the crystal grain boundaries. Even though the dopant is introduced into the film, it is impossible to control the valence electrons and the dark conductivity as desired.

In the case of a film containing 15 vol % or more of non-crystal grains in the crystal grain boundaries or in the intercrystal space, with the dangling bond terminated with hydrogen atoms (H), the structure is flexible and the defects at the crystal grain boundaries decrease. For this reason, the deposited film according to this invention is by far superior in doping efficiency to that which does not have non-crystal grain domain. Incidentally, with non-crystal grain domain less than 15 vol %, the deposited film is easily peeled off from the substrate on account of its insufficient flexibility in structure.

The foregoing suggests that the deposited film should contain more than 15 vol % of non-crystal grain domain.

(5) The procedure of (1) mentioned above was repeated to prepare samples Nos. 25~36, samples Nos. 37~48, and samples Nos. 49~60 (on $SiO_2$ film) and also to prepare samples Nos. 25'~36', samples Nos. 37'~48', and samples Nos. 49'~60'(on quartz substrate).

Figure 10:
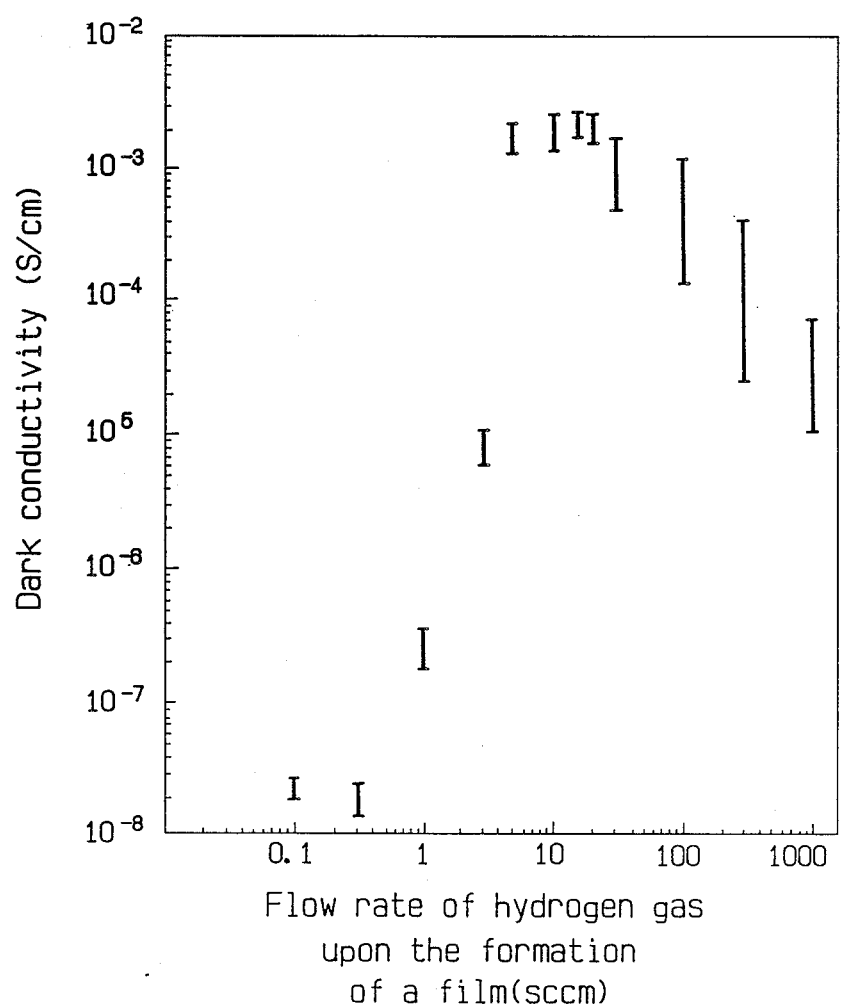
FIG. 10 is a graph showing the inter relations between the dark conductivities and the flow rates of hydrogen gas ($H_2$) at the time of film formation in the below-mentioned Experiment C.

Each of samples Nos. 25~60 which were not irradiated with intense light was examined for dark conductivity in the same manner as mentioned above. The results are shown in FIG. 10. It is noted from FIG. 10 that the value of dark conductivity greatly varies depending on the film forming conditions, and that the degree of variation is great in the case where the flow rate of hydrogen gas is high.

It was found that samples Nos. 25'~60'are almost uniform in the content of hydrogen atoms in the film and also in the ratio of crystal grain domain.

In the case of samples Nos. 25'~60', those which were prepared with a hydrogen flow rate higher than 30 sccm gave greatly varied values of dark conductivity. In such cases, the content of hydrogen atoms in the film is more than 4 atomic % and the ratio of crystal grain domain is less than 65 vol %.

The foregoing suggests that where the ratio of non-crystal grain domain per unit volume in the film is greater than 30 vol %, the crystal grains are electrically separated from one another and the conduction is determined by the non-crystal grain domain, which leads to a low dark conductivity. This restricts the application areas of the deposited film.

The control of valence electrons by dopants and the change of dark conductivity depending on dopants greatly differ from the crystal grain domain to the non-crystal grain domain; therefore, it is difficult to obtain the desired control of valence electrons and the desired change of dark conductivity. In the case where dopants enter the non-crystal grain domain, but not the crystal grain domain, the resulting deposited film greatly fluctuates in its characteristics. This makes it impossible to obtain the dark conductivity as desired.

The dark conductivity greatly changes as shown in FIG. 8 if the deposited film is irradiated with intense light. This may be elucidated as follows: In the case where the ratio of the non-crystal grain domain exceeds 35 vol %, the content of hydrogen atoms in the deposited film is very high. This brings about a situation in which the hydrogen atoms are easily released from the film as the film changes with time and the boundaries change. The release of hydrogen atoms deteriorates the characteristics of the film.

The foregoing suggests the following. For the ZnSe:H film to be reproducible and stable, it is necessary that the content of hydrogen atoms (H) in the film be less than 4 atomic % and the ratio of the crystal grain domain per unit volume in the film be more than 65 vol %.

(6) The procedure (1) mentioned above was repeated to form ZnSe:H films and ZnSe:H:Li films on quartz glass substrates under varied conditions. Thus prepared samples were examined for the relation between the content of hydrogen atoms in the film and the ratio of crystal grain domain in the film, and the relation between the content of hydrogen atoms in the film and the electrical characteristics (such as the ratio of change in conductivity after irradiation with AM-1, the drift mobility of holes, and the dark conductivity) in the same manner as mentioned above. It was found that the content of hydrogen atoms in the film and the ratio of crystal grain domain in the film almost coincide with those specified in the above-mentioned experiments, and that there is a close correlation between the content of hydrogen atoms in the film and the electrical characteristics of the film. Thus it was found that the optimum content of hydrogen atoms is in the range of 1 to 4 atomic %. It was also found that the ratio of crystal grain domain in the film which satisfies the specific content of hydrogen atoms in the film is 65 to 85 vol %, preferably 70 to 80 vol %.

The present invention was completed on the basis of the above-mentioned experimental results. The functional deposited film of the present invention is composed of zinc atoms (Zn), selenium atoms (Se), and at least hydrogen atoms (H), as mentioned above. Thus the present invention relates to an outstanding functional deposited film made of a substance represented by ZnSe:H, with the content of hydrogen atoms being 1 to 4 atomic % and the ratio of crystal grains per unit volume being 65 to 85 vol %. The present invention relates also to an outstanding functional deposited film which is formed by doping the above-mentioned functional deposited film with a specific dopant so that it is made of a substance represented by ZnSe:H:M (where M denoted a dopant involved).

Both types of the deposited film of the present invention are expected to find use in broad application areas. The film may be deposited on a flat or cylindrical substrate according to the intended application, or may also be deposited on a film formed on such a substrate.

The ZnSe:H film of the present invention contains uniformly distributed Zn atoms and Se atoms in stoichiometric amounts and also contains hydrogen atoms in an amount of 1 to 4 atomic %. With the hydrogen atoms terminating the dangling bond of Zn atoms and/or Se atoms or being present free, the ZnSe:H film has the crystal grain domains and the non-crystal grain domains. The crystal grain domains are uniformly distributed in the film, and the ratio of the crystal grain domains per unit volume in the film is 65 to 85 vol %. Thus the ZnSe:H film has a uniform structure and composition.

The ZnSe:H film of the present invention has such a desired state that the stress that occurs in the film is relieved. Therefore, it has outstanding electrical and mechanical characteristics and it has also good adhesion to the substrate and other films.

The functional deposited film of the present invention has such a state that the dangling bond of the film constituting atoms is reduced to a desired low level. This makes it possible to introduce a p-type dopant into the film very easily and efficiently. (In the case of conventional ZnSe film, it was difficult to impart p-type conductivity to it by the introduction of a p-type dopant.) Therefore, according to the present invention, it is possible to provide a deposited ZnSe:H:$M_p$ film (where $M_p$ represents a p-type dopant). The ZnSe:H:$M_p$ film has outstanding p-type semiconductor characteristics, a desired state in which the stress is relieved as mentioned above, very good electrical and mechanical characteristics, and good adhesion to the substrate and other films.

The ZnSe:H:$M_p$ film of the present invention contains a p-type dopant (represented by $M_p$) which is selected from the I-A Group elements (i.e., Li, Na, K, and Rb), the I-B Group elements (i.e., Cu and Ag), and the V-A Group elements (i.e., P, As, and Sb). Preferable among them are Li and P. The amount of $M_p$ in the film should be 2 to $1 \times 10^4$ atomic ppm, preferably 30 to $5 \times 10^3$ atomic ppm, and most desirably 50 to $\times 10^3$ atomic ppm.

In addition, the ZnSe:H film of the present invention permits the easy introduction of an n-type dopant as well as said p-type dopant. (An n-type dopant is represented by $M_n$ hereinafter.) Thus the present invention provides an outstanding functional deposited film of n-type conductivity. In this case, $M_n$ is selected from III-B Group elements (i.e., B, Al, Ga, and In), IV-B Group elements (i.e., Si, Ge, C, and Sn), and VII-B Group elements (i.e., F, Cl, Br, and I). Preferable among them are Al, Ga, In, and B.

The amount of $M_n$ in the film should be 2 to $1 \times 10^4$ atomic ppm, preferably 30 to $5 \times 10^3$ atomic ppm, and most desirably 50 to $1 \times 10^3$ atomic ppm.

As mentioned above, the functional deposited film of the present invention is characterized by that the content of hydrogen atoms in the film is in a specific range and the ratio of crystal grain domains per unit volume is also in a specific range. With a hydrogen content less than 1 atomic %, the deposited film is not satisfactory on account of an excessive amount of dangling bonds. With a hydrogen content in excess of 4 atomic %, the deposited film is not satisfactory on account of lattice disturbance, voids, and defects. On the other hand, with the ratio of crystal grain domain less than 65 vol %, the deposited film is not satisfactory because the amount of crystal grains, which is one of the factors affecting the electrical properties, is reduced. With the ratio of crystal grain domain in excess of 85 vol %, the deposited film is not satisfactory on account of the formation of grain boundary (resulting from the direct bonding of crystals) which leads to lattice defects.

The functional deposited film provided by the present invention is characterized by its good electrical conductivity. Upon combination with a substrate and a semiconductor film of different material or conductivity type according to an intended object, it will find use as an electronic device such as photovoltaic elements.

The following describes a typical example of the photovoltaic element based on the functional deposited film of the present invention. The following description, however, is not intended to restrict the application area of the functional deposited film of the present invention.

Figure 1:
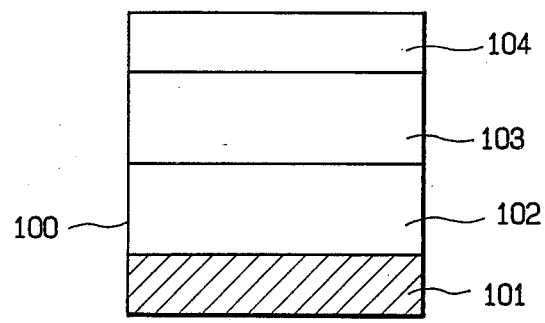
FIG. 1 is a schematic representation showing the typical layer structure of a photovoltaic element in which the functional deposited film according to the present invention is employed.

FIG. 1 schematically shows a typical example of a photovoltaic element of layer structure which is based on the functional deposited film of the present invention.

In FIG. 1 there is shown a photovoltaic element 100 which is composed of a substrate 101, an n-type semiconductor layer 102, a p-type semiconductor layer 103 (the functional deposited film of the present film), and an electrode 104 placed on top of the other.

In the meantime, needless to say, it is possible to interchange the n-type semiconductor layer and the p-type semiconductor layer according to the intended use.

The following will describe the substrate, n-type semiconductor layer, and electrode of the photovoltaic element. The p-type semiconductor is the functional deposited film of the present invention which has been described above. Therefore, the explanation on it is not repeated in the following.

Substrate

The substrate 101 used in the present invention may be of single crystal material or non-single crystal material. In addition, it may be an electrically conductive material or insulating material. Examples of the conductive substrate include Fe, Ni, Cr, Al, Mo, Au, Nb, Ta, V, Ti, Pt, and Pb and alloys thereof (such as brass and stainless steel). Examples of the insulating substrate include glass, ceramics, and synthetic resin (in the form of film or sheet) such as polyester, polyethylene, polycarbonate, cellulose acetate, polypropylene, polyvinyl chloride, polyvinylidene chloride, polystyrene, polyamide, and polyimide. The substrate of insulating material should preferably be given treatment to make at least one surface electrically conductive and the semiconductor layer should be formed on the conductive surface.

In the case of glass substrate, for example, it may be given electrical conductivity by forming a thin film of Ni, Cr, Al, Mo, Au, Ir, Nb, Ta, V, Ti, Pt, Pd, $In_2O_3$, $SnO_2$, or ITO ($In_2O_3+SnO_2$) on the surface thereof. In the case of synthetic film (e.g., polyester film), it may be given electrical conductivity by forming a thin film of Ni, Cr, Al, Ag, Pb, Zn, Ni, Au, Mo, Ir, Nb, Ta, V, Tl, Pt, Pd, or $In_2O_3$ on the surface thereof by vacuum deposition, electron beam deposition, or sputtering at a temperature not detrimental to the substrate material, or by laminating the surface with one of said metals.

The single crystal substrate may be formed by slicing into wafers a single crystal of Si, Ge, C, NaCl, KCl, LiF, GaSb, InAs, InSb, GaP, MgO, $CaF_2$, $BaF_2$, or $\alpha$-$Al_2O_3$. The wafer may have an epitaxially grown layer of the same substance as the wafer or of a substance having a lattice constant close to that of the wafer.

The substrate may take on any shape according to the intended object and application. It may be a flat plate, long belt, or cylinder, each having a smooth surface or irregular surface. The substrate may have a thickness suitable the desired photovoltaic element. For a photovoltaic element which is required to be flexible, the substrate can be made as thin as possible so long as it functions satisfactorily. Usually, the substrate is thicker than 10 $\mu$m from the standpoint of manufacturing and handling properties and mechanical strength.

n-type semiconductor layer

The n-type semiconductor layer 102 may be the above-mentioned ZnSe:H film or ZnSe:H:$M_n$ film formed by doping the ZnSe:H film with an n-type dopant (represented by $M_n$).

Electrode

The electrode 104 may be made of a transparent or opaque material. The selection of the material depends on whether the above-mentioned substrate 101 is transparent or opaque. (In the case where the substrate 101 is made of an opaque material such as metal, the light to generate photovoltage is shone through the electrode 104.)

The transparent electrode may be made of thin metal oxide film or thin metal film. Preferred examples include thin films of ITO ($In_2O_3+SnO_2$), SnO, ZnO, Au, Al, and Cu.

The opaque electrode may be made of thin metal film. Preferred examples include thin films of Al, Cr, Ni, Ag, Pt, Au, Mo, Ir, Nb, Ta, V, Ti, and Pd.

The above-mentioned electrode material should have a proper high transparency and a proper low resistance, so that the electrode does not reduce the incident light to the photovoltaic element and also does not add to resistance. The transparent electrode should referably have a transparency higher than 85% and a resistance lower than 100 $\Omega$.

The present invention embraces the following three processes for producing the above-mentioned functional deposited film of non-single crystal ZnSe:H containing hydrogen atoms.

(1) A process for producing the functional deposited film made of ZnSe:H which comprises the steps of introducing an Se-containing raw material gas and hydrogen gas ($H_2$) into an activating zone independent of the film-forming chamber, imparting activating energy to these gases, thereby forming an Se-containing precursor and hydrogen radicals in atomic state, introducing the gas containing said precursor and hydrogen radicals into the film-forming chamber, simultaneously introducing a Zn-containing raw material gas into said film-forming chamber, and causing said gases to chemically react with each other in the space covering the surface of the temperature-controlled substrate arranged in said film-forming chamber.

(2) A process for producing the functional deposited film made of ZnSe:H which comprises the steps of introducing an Se-containing raw material gas, hydrogen gas ($H_2$), and a Zn-containing gas into the film-forming chamber in which a substrate is arranged and the gases are mixed, applying a high-frequency power to a cathode installed in said film-forming chamber, thereby producing plasma in the reaction space of the film-forming chamber, and causing said gases to chemically react with one another through decomposition, polymerization, radicalization, and ionization.

(3) A process for producing the functional deposited film made of ZnSe:H which comprises the steps of introducing an Ar gas and $H_2$ gas into the film-forming chamber in which a substrate is arranged and a cathode is arranged opposite to said substrate a certain distance apart, said cathode being provided on the surface thereof with a target of polycrystal ZnSe, applying a high-frequency power to said cathode, thereby performing the sputtering of said polycrystal ZnSe and also forming a plasma environment in said reaction space, and causing Se and Zn in atomic state emitted from the target and hydrogen in the atomic state formed by the plasma exitation of the $H_2$ gas to chemically react with one another in the space near the surface of the substrate.

The functional deposited film produced by any of the above-mentioned three processes (1) to (3) may be given semiconductor characteristics by the introduction of a dopant. Particularly, it is possible to introduce a p-type dopant into the ZnSe:H film. This makes it possible to provide a ZnSe:H film having the p-type conductivity which could not be produced in the past. The doping may be accomplished by introducing a gas containing a p-type dopant, alone or in combination with hydrogen gas, into the film-forming chamber.

The above-mentioned processes (1) to (3) of the present invention will be described in more detail in the following.

Processes (1) and (2)

The raw material to introduce Zn ("raw material A" for short) should preferably be an easily gasifiable alkyl zinc represented by the formula R-Zn (where R denotes an alkyl residue having 1 to 4 carbon atoms). Typical examples of the alkyl zinc include dimethyl zinc (DMZn) and diethyl zinc (DEZn). Being liquid at normal temperature, these organozinc compounds should be gasified by bubbling with an inert gas carrier such as Ar and He at the time of use.

The raw material to introduce Se ("raw material B" for short) should preferably be a gaseous or easily gasifiable hydrogen selenide ($H_2Se$), selenium halide, or alkyl selenium compound represented by the formula R'-Se (where R' denotes an alkyl residue having 1 to 4 carbon atoms). Preferred examples of the selenium halide include selenium hexafluoride. Preferred examples of the alkyl selenium compound include dimethyl selenium (DMSe) and diethyl selenium (DESe).

Among the compounds of raw material B, those which are not gaseous but liquid or solid at normal temperature should be gasified at the time of use by bubbling with an inert carrier gas such as Ar and He, or by sublimation with heating.

In the production of the ZnSe:H film by the process (1) or (2), the $H_2$ gas plays an important part.

According to a preferred embodiment of the process (1), the gaseous raw material B and $H_2$ gas in combination are introduced into the activation area, in which they are excited by activating energy. For non-gaseous raw material B, the activating zone may be constructed such that raw material B is gasified by the aid of said inert gas or $H_2$ gas and the thus formed gas is excited.

In the process (1), it is possible to introduce $H_2$ gas alone into an activating zone independent of said activating zone, in which the $H_2$ gas is excited.

The activating energy may be discharge energy, thermal energy, or light energy, or a combination thereof.

The excitation of raw material B may be accomplished by the aid of a proper catalyst as well as activating energy.

The above-mentioned process (1) or (2) of the present invention may be practiced in the following manner to produce the ZnSe:H film having the p-type or n-type conductivity (referred to as p-type ZnSe:H:M film hereinafter [where M denotes a p-type dopant or n-type dopant]). That is, a gaseous raw material to provide a p-type dopant or n-type dopant ("p-type or n-type dopant raw material" for short) is introduced, alone, or together with gaseous raw material A or gaseous raw material B, or together with $H_2$ gas, into the film-forming chamber.

The p-type or n-type dopant raw material should preferably be a gaseous or easily gasifiable compound. Examples of the p-type dopant raw material include organolithium compounds such as propyl lithium ($LiC_3H_7$) and sec-butyl lithium ($Li(sec-C_4H_9)$) which are liquid at normal temperature; and inorganic lithium compounds such as lithium sulfide ($Li_2S$) and lithium nitride ($Li_3N$) which are solid at normal temperature. Preferable among them are $AsH_3$, $PH_3$, $P_2H_4$, $AsF_3$, $AsCl_3$, $PF_5$, $PF_3$, $PCl_3$, $SbH_3$, and $SbF_3$.

In the case where the p-type dopant raw material is an organolithium compound which is liquid at normal temperature, it should be gasified at the time of use by bubbling with an inter gas such as Ar or He or $H_2$ gas as a carrier gas, as mentioned in the explanation for raw material A and raw material B. In the case where the p-type dopant is an inorganic lithium compound which is solid at normal temperature, it should be gasified at the time of use by sublimation with heating by the aid of a carrier gas such as Ar and He in a sublimation furnace.

The n-type dopant raw material, like the p-type dopant raw material, may be selected from those compounds which are gaseous or easily gasifiable at normal temperature. Preferred examples of such compounds include trimethyl aluminum ($Al(CH_3)_3$), triethyl aluminum ($Al(C_2H_5)_3$), trimethyl gallium ($Ga(CH_3)_3$), triethyl gallium ($Ga(C_2H_5)_3$), trimethyl indium ($In(CH_3)_3$), triethyl indium ($In(C_2H_5)_3$), diborane ($B_2H_6$), monosilane ($SiH_4$), disilane ($Si_2H_6$), monogermane ($GeH_4$), tin hydride ($SnH_4$), methane ($CH_4$), ethane ($C_2H_6$), ethylene ($C_2H_4$), acetylene ($C_2H_2$), fluorine ($F_2$), and chlorine ($Cl_2$).

In the case where the n-type dopant raw material is liquid at normal temperature, it should be gasified at the time of use by bubbling with an inter gas such as Ar or He or $H_2$·gas as a carrier gas, as mentioned in the explanation for the p-type dopant. In the case where the n-type dopant raw material is solid at normal temperature, it should be gasified at the time of use by sublimation with heating by the aid of a carrier gas such as Ar and He in a sublimation furnace.

The above-mentioned process (1) or (2) of the present invention may be practiced in the following manner to produce the ZnSe:H film or the p-type or n-type ZnSe:H:M film. That is, the substrate is kept at 5020 to 600° C., preferably 50° to 500° C., and most desirably 100° to 400° C. during film formation. So long as the substrate temperature is in the range of 50° to 600° C., usually there is obtained a deposited film in which crystal grain domains and non-crystal grain domains coexist, if the amount of hydrogen radicals or the flow rate of $H_2$ gas is changed during film formation.

One of the important film forming factors in the above-mentioned processes (1) and (2) is the internal pressure. The internal pressure should be established at $1 \times 10^{-4}$ to 50 Torr, preferably $5 \times 10^{-3}$ to 10 Torr, and most desirably $1 \times 10^{-3}$ to 5 Torr. To maintain this internal pressure, it is necessary to properly control, according to the desired film, the flow rate of gaseous raw material A, gaseous raw material B, hydrogen gas, and gaseous p-type dopant raw material which enter and leave the film forming chamber.

In the process (1) of the present invention, gaseous raw material A and gaseous raw material B and hydrogen radicals in atomic state are introduced into the film forming chamber at a proper ratio which is established according to the desired characteristics of the deposited film. That is, the ratio of the total amount of the first two components to the amount of the last component should be 1:10 to $1:10^4$, preferably 1:25 to $1:10^3$.

In the process (2) of the present invention, gaseous raw material A and gaseous raw material B and hydrogen gas are introduced into the film forming chamber at a proper ratio which is established according to the high-frequency power to be applied, the internal pressure, and the amount of hydrogen to be contained in the deposited film which are related to one another. That is, the ratio of the total amount of the first two components to the amount of the last component should be 1:20 to $1:5 \times 10^4$, preferably 1:30 to $1:5 \times 10^3$.

Process (3)

This process is designed to produce the above-mentioned ZnSe:H film or p-type or n-type ZnSe:H:M film by means of sputtering.

The target used in sputtering is typically polycrystal ZnSe. It may also be possible to use two targets of Zn and Se. In the case where sputtering is performed by the application of high-frequency power to the target, it is preferable to form a gas atmosphere composed of $H_2$ gas and Ar gas and/or He gas.

In the case where the p-type or n-type ZnSe:H:M film is produced according to process (3), the above-mentioned gas atmosphere for sputtering should contain a prescribed amount of p-type or n-type dopant raw material which has been explained for process (1) or (2).

In the production of ZnSe:H film or p-type or n-type ZnSe:H:M film by process (3), the important film forming conditions include the target-to-substrate distance, the high-frequency power, the substrate temperature, the internal pressure, and the gas flow rate. The target-to-substrate distance may vary depending on the construction and scale of the equipment used. Usually, it is 20 to 100 mm, preferably 40 to 80 mm. The high-frequency power may vary depending on the type and size of the target. Usually, it is 0.3 to 7 $W/cm^2$, preferably 0.8 to 4 $W/cm^2$. The substrate temperature should be established in the same range as in the above-mentioned process (1) or (2). The internal pressure at the time of film forming should be $1 \times 10^{-5}$ to $1 \times 10^{-1}$ Torr, preferably $1 \times 10^{-4}$ to $1 \times 10^{-2}$ Torr. The $H_2$ gas and Ar gas and/or He gas and the p-type or n-type dopant raw material should be properly controlled in relation to the amount of Zn and Se in atomic state which are emitted from the target during sputtering. The flow rate of the gases should be controlled by mass flow controllers such that the gas atmosphere in the reaction zone of the film forming chamber contains a prescribed amount of hydrogen atoms (H) or a prescribed amount of hydrogen atoms (H) and p-type or n-type dopant (M) (or H +M). In addition, the gases are introduced into the film forming chamber and then discharged from the film forming chamber such that the above-mentioned internal pressure is maintained. According to the present invention, a certain ratio should be established between the total amount of Zn and Se in atomic state and the amount of hydrogen atoms (H) or the amount of hydrogen atoms (H) and dopant (M) (or H +M). The ratio should be $10^2:1$ to $1:10^3$, preferably 10:1 to $1:10^2$, and most desirably 5:1 to 1:50.

Figure 3:
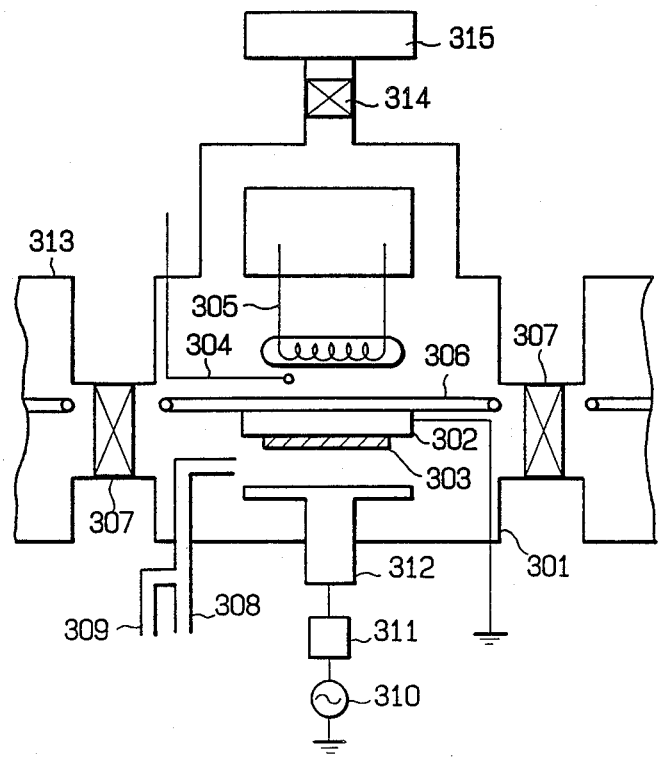
FIG. 3 is a schematic diagram showing another apparatus for forming a functional deposited film which is suitable for practicing the later described process (2) of the present invention.
Figure 4:
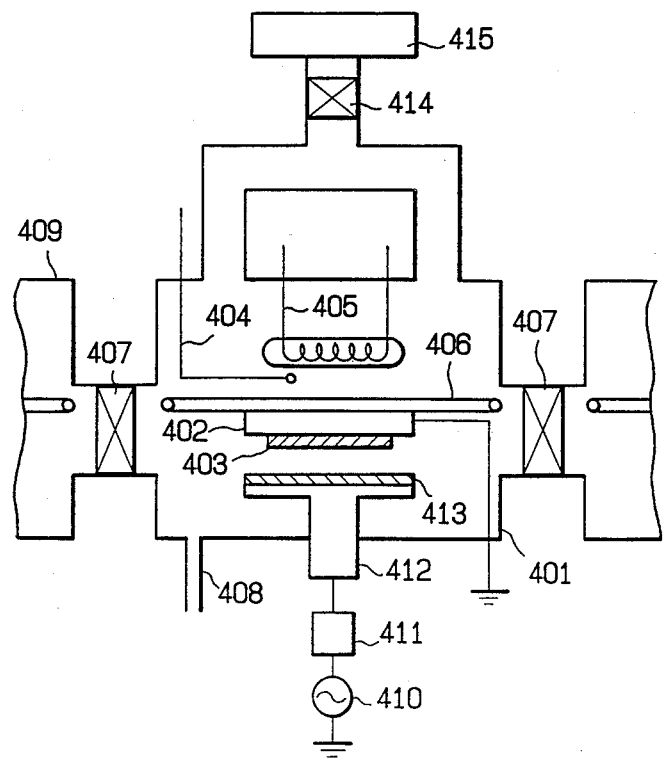
FIG. 4 is a schematic diagram showing a further apparatus for forming a deposited film which is suitable for practicing the later described process (3) of the present invention.

As mentioned above, the process of the present invention may be practiced by using a proper apparatus. Typical examples of the apparatus are shown in FIGS. 2 to 4.

DESCRIPTION OF THE PREFERRED EMBODIMENTS

The functional deposited film and the process of the invention will be described in more detail with reference to the following examples in which the shown apparatus was employed.

FIG. 2 schematically shows a preferred example of the apparatus used to practice process (1) of the present invention. In FIG. 2 there is shown a film forming chamber 201 in which is installed a substrate holder 202. There is shown a substrate 203 which is fixed onto the substrate holder 202. The substrate 203 is heated by radiation from an infrared heater 205, while being monitored by a temperature monitor 204. The substrate holder 202 is transferred to the other film forming chamber 213 or a load lock chamber 212 through a gate valve 207 by a substrate transfer unit 206. Raw material gas (A) is introduced into the film forming chamber 201 through the gas inlet pipe (A) 208. Raw material gas (B) and hydrogen gas are introduced through the gas inlet pipe (B) 209. The gases are activated in an activation chamber 210 by an activating means 211, and then introduced into the film forming chamber 201. The activating means is any means to decompose, polymerize, radicalize, or ionize raw material gases (A) and (B) and hydrogen gas by the aid of electric energy (such as direct current, high-frequency, and micrwwave), light energy, heat energy, or catalyst, thereby promoting the reaction of raw material gases (A) and (B) and hydrogen gases and also promoting the reaction on the substrate surface.

The gases in the film forming chamber is discharged through a valve 214 by an evacuating pump, so that the pressure in the film forming chamber is kept at a certain level.

The following procedure is employed to produce the ZnSe:H film of the present invention by using the apparatus shown in FIG. 2.

At first, Se-containing raw material gas (A) such as DESe and hydrogen gas are supplied through the gas inlet pipe 209. The gases are activated in the activating chamber 210 by activating energy provided by the activating means 211. Thus there are formed an Se-containing precursor and hydrogen radicals in atomic state.

On the other hand, the Zn-containing raw material gas (A) such as DEZn entering through the other gas inlet pipe 208 is introduced into the film forming chamber 201 without being excited by the activating means because the discharge opening of the gas inlet pipe 208 is located downstream the activating chamber 210. In the film forming chamber, the Zn-containing raw material gas (A) reacts with hydrogen radicals to form a Zn-containing precursor.

Upon introduction into the film-forming chamber, the Se-containing precursor, Zn-containing precursor, and hydrogen radicals react with one another to form a ZnSe:H film containing a desired amount of hydrogen.

It is considered that hydrogen radicals take part in the reaction for film deposition on the substrate surface. That is, they remove unnecessary alkyl groups from the deposited film and also function as a terminator for dangling bond in the ZeSe thin film. The activating energy in the activating chamber can be brought to the film-forming chamber if the amount of energy imparted by the activating means is increased according to need to promote the reaction of Zn-containing raw material gas with hydrogen radicals and the reaction of Zn-containing precursor with Se-containing precursor in the reaction chamber and also to increase the amount of hydrogen radicals to be supplied. The amount of hydrogen atoms (H) contained in the ZnSe:H film can be controlled by properly establishing the flow rate of hydrogen gas introduced as a raw material gas, the amount of activating energy to be imparted, the pressure in the film-forming chamber, the distance between the activating chamber 210 and the discharge opening of the gas inlet pipe 208, and the substrate temperature.

The deposited film can be made p-type or n-type by adding the above-mentioned dopant to the raw material gas (A) or raw material gas (B).

FIG. 3 schematically shows a preferred example of the apparatus used to practice process (2) of the present invention. When this apparatus is in operation, raw material gas (A) is introduced through the gas inlet pipe (A) 308 and raw material gas (B) and hydrogen gas are introduced through the gas inlet pipe (B) 309. The mixed gas is decomposed, polymerized, radicalized, and ionized in plasma generated by high-frequency power applied to the cathode 312 from the high-frequency source 310 through the matching circuit. As the results of reactions, a ZnSe:H thin film is formed on the substrate 303. By continuing the supply of raw materials together with a dopant raw material, the deposited film is doped into p-type or n-type.

FIG. 4 schematically shows a preferred example of the apparatus used to practice process (3) of the present invention. There is shown a cathode 412, onto which is attached a target 413 of ZnSe polycrystal. Ar gas and $H_2$ gas are introduced through the gas inlet 408 and they are ionized by plasma generated by high-frequency power applied to the cathode. The resulting Ar ions and H ions bring about the sputtering of the target 413. Thus a ZnSe:H thin film is deposited on the substrate 403. By mixing the Ar gas and H, gas with the above-mentioned dopant raw material, the deposited film is doped into p-type or n-type.

EXAMPLE 1

This example was practiced by using the apparatus shown in FIG. 2, with the gas inlet pipe 208 and the activating chamber 210 positioned 80 mm apart.

At first, the quartz glass substrate 203 was set on the substrate holder 202. The substrate was transferred from the load lock chamber 212 into the film-forming chamber 201 through the gate valve 207 by means of the substrate transfer unit 206. A p-type ZnSe:H film and a non-doped ZnSe:H film were prepared under the film-forming conditions as shown in Table 3.

The non-doped ZnSe:H film was prepared under the same conditions (shown in Table 3) as for the doped ZnSe:H film except that the dopant raw material ($LiC_3H_7$) was not introduced. After 30 minutes of deposition, the p-type ZnSe:H:Li film was 1.0 $\mu$m thick and the non-doped ZnSe:H film was 0.9 $\mu$m thick. Subsequently, the substrate holder 202 was transferred to the load lock chamber 212 through the gate valve 207, and discharged after cooling.

The deposited film was placed in a separate vacuum deposition apparatus, in which a comb-shaped aluminum electrode (5 mm long and 250 $\mu$m apart) was formed on the deposited film by resistance heating. Thus there were obtained samples A-1 and A-2. The dark conductivity $\sigma_d$ (S/cm) was measured at an applied voltage of 10 V. Each of the p-type ZnSe:H:Li film and non-doped ZnSe:H film was partly used for the measurements of the ratio of crystal grain domains by a TEM and the determination of H content in the deposited film. The results are shown in Table 11.

EXAMPLE 2

This example was practiced by using the apparatus shown in FIG. 3. At first, the quartz glass substrate 303 was set on the substrate holder 302. The substrate was transferred from the load lock chamber 313 into the film-forming chamber 301 through the gate valve 307 by means of the substrate transfer unit 306. After 45 minutes of deposition under the conditions shown in Table 4, there were obtained a 1.0 $\mu$m thick p-type ZnSe:H:Li film and a 0.9 $\mu$m thick non-doped ZnSe:H film. The non-doped ZnSe:H film was prepared under the same conditions (shown in Table 4) as for the doped ZnSe:H film except that the dopant raw material ($LiC_3H_7$) was not introduced.

Subsequently, the same procedure as in Example 1 was repeated to prepare samples B-1 and B-2. Their evaluation results are shown in Table 11.

EXAMPLE 3

This example was practiced by using the apparatus shown in FIG. 4. At first, the quartz glass substrate 403 was set on the substrate holder 402. The substrate was transferred from the load lock chamber 409 into the film-forming chamber 401 through the gate valve 407 by means of the substrate transfer unit 406. After 50 minutes of deposition under the conditions shown in Table 5, there were obtained a 1.0 $\mu$m thick p-type ZnSe:H:Li film and a 1.0 $\mu$m thick non-doped ZnSe:H film.

Subsequently, the same procedure as in Example 1 was repeated to prepare samples C-1 and C-2. Their evaluation results are shown in Table 11.

EXAMPLE 4

This example was practiced by using the apparatus shown in FIG. 2. At first, the quartz glass substrate 203 was set on the substrate holder 202. The substrate was transferred from the load lock chamber 212 into the film-forming chamber 201 through the gate valve 207 by means of the substrate transfer unit 206. After 30 minutes of deposition under the conditions shown in Table 6, there were obtained a 1.0 $\mu$m thick p-type ZnSe:H:P film and a 0.9 $\mu$m thick non-doped ZnSe:H film.

The non-doped ZnSe:H film was prepared under the same conditions (shown in Table 6) as for the p-type film except that the dopant raw material ($PH_3$) was not introduced. Subsequently, the same procedure as in Example 1 was repeated to prepare samples D-1 and D-2. Their evaluation results are shown in Table 11.

EXAMPLE 5

This example was practiced by using the apparatus shown in FIG. 2, with the gas inlet pipe 208 and the activating chamber 210 positioned 80 mm apart.

At first, the quartz glass substrate 203 was set on the substrate holder 202. The substrate was transferred from the load lock chamber 212 into the film-forming chamber 201 through the gate valve 207 by means of the substrate transfer unit 206. An n-type ZnSe:H film was prepared under the film-forming conditions as shown in Table 7.

After 35 minutes of deposition, there were obtained a 1.0 $\mu$m thick n-type ZnSe:H:Al film and a 1.0 $\mu$m thick non-doped ZnSe:H film. Subsequently, the substrate holder 202 was transferred to the load lock chamber 212 through the gate valve 207, and discharged after cooling.

The deposited film was placed in a separate vacuum deposition apparatus, in which a comb-shaped aluminum electrode (5 mm long and 250 $\mu$m apart) was formed on the deposited film by resistance heating. Thus there was obtained sample $A_n$-1. The dark conductivity $\sigma_d$(S/cm) was measured at an applied voltage of 10 V. The n-type ZnSe:H:Al film was partly used for the measurements of the ratio of crystal grain domains by a TEM and the determination of H content in the deposited film. The results are shown in Table 11.

EXAMPLE 6

This example was practiced by using the apparatus shown in FIG. 3. At first, the quartz glass substrate 303 was set on the substrate holder 302. The substrate was transferred from the load lock chamber 313 into the film-forming chamber 301 through the gate valve 307 by means of the substrate transfer unit 306. After 45 minutes of deposition under the conditions shown in Table 8, there was obtained a 1.0 μm thick n-type ZnSe:H:Al film.

Subsequently, the same procedure as in Example 1 was repeated to prepare sample $B_n$-1. The evaluation results are shown in Table 11.

EXAMPLE 7

This example was practiced by using the apparatus shown in FIG. 4. At first, the quartz glass substrate 403 was set on the substrate holder 402. The substrate was transferred from the load lock chamber 409 into the film-forming chamber 401 through the gate valve 407 by means of the substrate transfer unit 406. After 50 minutes of deposition under the conditions shown in Table 9, there was obtained a 1.0 μm thick n-type ZnSe:H:Al film.

Subsequently, the same procedure as in Example 1 was repeated to prepare sample $C_n$-1. The evaluation results are shown in Table 11.

EXAMPLE 8

This example was practiced by using the apparatus shown in FIG. 2. At first, the quartz glass substrate 203 was set on the substrate holder 202. The substrate was transferred from the load lock chamber 212 into the film-forming chamber 201 through the gate valve 207 by means of the substrate transfer unit 206. After 30 minutes of deposition under the conditions shown in Table 10, there was obtained a 1.0 μm thick n-type ZnSe:H:Ga film.

Subsequently, the same procedure as in Example 1 was repeated to prepare sample $D_n$-1. The evaluation results are shown in Table 11.

COMPARATIVE EXAMPLE

Samples E-1 and E-2 for comparison were prepared under the film-forming conditions as shown in Table 5, using the same substrate, apparatus, and electrode structure as in Example 3, except that $H_2$ gas was not introduced or both $H_2$ gas and $LiC_3H_7$ were not introduced. Their evaluation results are shown in Table 11.

The characteristic properties of samples prepared in Examples 1 to 8 and Comparative Example are shown in Table 11. Incidentally, the evaluation of conductivity type was performed by measuring the thermoelectromotive force.

The ratio of crystal grain domains in the film was measured by observing the TEM transmission images of the ZnSe:H film and p-type and n-type ZnSe:H:M films formed on both quartz glass substrates and silicon wafers with an $SiO_2$ film formed thereon by the thermal oxidation method.

The above-mentioned results indicate that the non-doped ZnSe:H films obtained in Examples 1 to 4 exhibit the weak n-type conductivity, the ZnSe:H:Li film and ZnSe:H:P film doped with a p-type dopant exhibit the p-type conductivity, and the ZnSe:H:Al film and ZnSe:H:Ga film doped with an n-type dopant exhibit the n-type conductivity. In other words, the conductivity type was controlled as desired. In addition, the content of hydrogen atoms in the deposited film and the ratio of crystal grain domains per unit volume of the deposited film were within the values specified in the invention.

In Comparative Example, an attempt was made to form a ZnSe film by the ordinary sputtering. The non-doped film exhibited the weak n-type conductivity; however, it was impossible to determine the conductivity type of the film doped with a p-dopant. The content of hydrogen atoms in both films was much lower than the value specified in the present invention; and it was difficult to recognize the crystal grain domains.

It is concluded from the foregoing that according to the present invention it is possible to control in an easy and stable manner the conductivity type of the ZnSe film which was incapable of p-type doping by the conventional method as shown in Comparative Example. The control of the conductivity type is accomplished by positively using $H_2$ gas and limiting the content of hydrogen atoms in the film and the ratio of crystal grain domains per unit volume in the film to the specific range as shown in Examples 1 to 8.

EXAMPLE 9

A pn-type photovoltaic element was prepared by laminating one over another a quartz glass plate as a substrate, an Ag thin film as a lower electrode, an n-type ZnSe:H:Al film as an n-type semiconductor layer (prepared in the same manner as $A_n$-1), a p-type ZnSe:H:Li film as a p-type semiconductor layer (prepared in the same manner as A-1), an ITO thin film as an upper electrode (prepared by sputtering), and an Al thin film as a collecting electrode.

The thus formed photovoltaic element was examined for photovoltaic characteristics by the ordinary method. It exhibited outstanding photovoltaic characteristics, i.e., high photoelectric conversion and good open circuit voltage characteristics.

TABLE 1

| | |
|---|---|
| Substrate temperature | 200° C. |
| Raw material gas (A) | DEZn 10 × $10^{-6}$ mol/min |
| | He 10 sccm |
| Raw material gas (B) | DESe 1.5 × $10^{-5}$ mol/min |
| | He 15 sccm |
| | $H_2$* 1.5 sccm ~ 1 slm |
| Pressure | 0.5 Torr |
| Discharging power | 200 W (2.45 GHz microwave) |
| Distance between activating chamber and discharge opening of gas inlet pipe | 5 cm |
| * Flow rate of $H_2$ gas | Sample No. 1  0.1 sccm |
| | No. 2  0.3 sccm |
| | No. 3  1 sccm |
| | No. 4  3 sccm |
| | No. 5  5 sccm |
| | No. 6  10 sccm |
| | No. 7  15 sccm |
| | No. 8  20 sccm |
| | No. 9  30 sccm |
| | No. 10  100 sccm |
| | No. 11  300 sccm |
| | No. 12  1 slm |

TABLE 2

| Sample No. | Composition (atomic %) | |
|---|---|---|
| | Zn | Se |
| 1 | 47 | 52 |
| 2 | 51 | 48 |
| 3 | 48 | 50 |
| 4 | 45 | 53 |
| 5 | 51 | 46 |
| 6 | 51 | 46 |
| 7 | 49 | 48 |
| 8 | 50 | 47 |

TABLE 2-continued

| | Composition (atomic %) | |
|---|---|---|
| Sample No. | Zn | Se |
| 9 | 48 | 48 |
| 10 | 46 | 50 |
| 11 | 51 | 47 |
| 12 | 49 | 48 |

TABLE 3

| | |
|---|---|
| Substrate temperature | 200° C. |
| Raw material gas (A) | |
| DEZn flow rate | $1.0 \times 10^{-6}$ mol/min |
| He flow rate | 10 sccm |
| Dopant raw material | |
| $LiC_3H_7$ | $1.0 \times 10^{-10}$ mol/min |
| Raw material gas (B) | |
| DESe flow rate | $1.5 \times 10^{-5}$ mol/min |
| He flow rate | 15 sccm |
| $H_2$ flow rate | 15 sccm |
| Pressure | 0.5 Torr |
| Discharging power | 200 W (2.45 GHz microwave) |

TABLE 4

| | |
|---|---|
| Substrate temperature | 300° C. |
| Raw material gas (B) | |
| DEZn flow rate | $1.2 \times 10^{-6}$ mol/min |
| Ar flow rate | 50 sccm |
| $H_2$ flow rate | 50 sccm |
| $LiC_3H_7$ | $1.0 \times 10^{-10}$ mol/min |
| Raw material gas (A) | |
| DESe flow rate | $1.6 \times 10^{-5}$ mol/min |
| Discharging power | 50 W (13.56 MHz) |

TABLE 5

| | |
|---|---|
| Target material | ZnSe polycrystal |
| Substrate temperature | 300° C. |
| Ar flow rate | 10 sccm |
| $LiC_3H_7$ flow rate | $1.3 \times 10^{-10}$ mol/min |
| $H_2$ flow rate | 10 sccm |
| Pressure | 0.05 Torr |
| Discharging power | 300 W (13.56 MHz) |

TABLE 6

| | |
|---|---|
| Substrate temperature | 200° C. |
| Raw material gas (A) | |
| DEZn flow rate | $1.2 \times 10^{-6}$ mol/min |
| Ar flow rate | 10 sccm |
| Raw material gas (B) | |
| DESe flow rate | $1.6 \times 10^{-5}$ mol/min |
| Ar flow rate | 15 sccm |
| $H_2$ flow rate | 15 sccm |
| $PH_3$ flow rate ($PH_3/H_2 = 1\%$) | 0.15 sccm |
| Pressure | 0.5 Torr |
| Discharging power | 200 W (2.45 GHz microwave) |

TABLE 7

| | |
|---|---|
| Substrate temperature | 200° C. |
| Raw material gas (A) | |
| DEZn flow rate | $1.0 \times 10^{-6}$ mol/min |
| He flow rate | 10 sccm |
| Dopant raw material | |
| $Al(CH_3)_3$ | $7 \times 10^{-11}$ mol/min |
| Raw material gas (B) | |
| DESe flow rate | $1.5 \times 10^{-5}$ mol/min |
| He flow rate | 15 sccm |
| $H_2$ flow rate | 15 sccm |
| Pressure | 0.5 Torr |

TABLE 7-continued

| | |
|---|---|
| Discharging power | 200 W (2.45 GHz microwave) |

TABLE 8

| | |
|---|---|
| Substrate temperature | 300° C. |
| Raw material gas (B) | |
| DEZn flow rate | $1.2 \times 10^{-6}$ mol/min |
| Ar flow rate | 50 sccm |
| $H_2$ flow rate | 50 sccm |
| $Al(CH_3)_3$ | $1.0 \times 10^{-10}$ mol/min |
| Raw material gas (A) | |
| DESe flow rate | $1.6 \times 10^{-5}$ mol/min |
| Discharging power | 50 W (13.56 MHz) |

TABLE 9

| | |
|---|---|
| Target material | ZnSe polycrystal |
| Substrate temperature | 300° C. |
| Ar flow rate | 10 sccm |
| $Al(CH_3)_3$ flow rate | $1.3 \times 10^{-10}$ mol/min |
| $H_2$ flow rate | 10 sccm |
| Pressure | 0.05 Torr |
| Discharging power | 300 W (13.56 MHz) |

TABLE 10

| | |
|---|---|
| Substrate temperature | 200° C. |
| Raw material gas (A) | |
| DEZn flow rate | $1.2 \times 10^{-6}$ mol/min |
| Ar flow rate | 10 sccm |
| Raw material gas (B) | |
| DESe flow rate | $1.6 \times 10^{-5}$ mol/min |
| Ar flow rate | 15 sccm |
| $H_2$ flow rate | 15 sccm |
| $Ga(CH_3)_3$ | 0.15 sccm |
| Pressure | 0.5 Torr |
| Discharging power | 200 W (2.45 GHz microwave) |

TABLE 11

| Sample No. | $\sigma_d$(S/cm) | Conductivity type | H content in film (atomic %) | Ratio of crystal grain domains in film (vol %) |
|---|---|---|---|---|
| A-1 | $4 \times 10^{-3}$ | p-type | 2.5 | 80 |
| A-2 | $3 \times 10^{-10}$ | n-type$_{(w)}$ | 3.5 | 75 |
| B-1 | $3 \times 10^{-5}$ | p-type | 3.2 | 65 |
| B-2 | $6 \times 10^{-10}$ | n-type$_{(w)}$ | 3.3 | 65 |
| C-1 | $4 \times 10^{-7}$ | p-type | 2.0 | 83 |
| C-2 | $1 \times 10^{-10}$ | n-type$_{(w)}$ | 3.0 | 70 |
| D-1 | $5 \times 10^{-3}$ | p-type | 3.0 | 73 |
| D-2 | $3 \times 10^{-10}$ | n-type$_{(w)}$ | 3.0 | 75 |
| $A_n$-1 | $7 \times 10^{-3}$ | n-type | 2.4 | 82 |
| $B_n$-1 | $9 \times 10^{-5}$ | n-type | 3.1 | 70 |
| $C_n$-1 | $1 \times 10^{-6}$ | n-type | 1.9 | 83 |
| $D_n$-1 | $8 \times 10^{-3}$ | n-type | 3.0 | 75 |
| E-1 | $1 \times 10^{-11}$ | p-type$_{(w)}$ | 0.005 | (*) |
| E-2 | $2 \times 10^{-12}$ | (*) | 0.002 | (*) |

(w) = weak
*uncertain

What is claimed is:
1. A functional deposited compound film on a non-single crystal substrate comprising of zinc, selenium, and hydrogen atoms, characterized in that the content of hydrogen atoms is 1 to 4 atomic% and the ratio of crystal grains per unit volume is 65 to 85 vol%.

2. A functional, deposited compound film as claimed in claim 1 which additionally contains a doping element belonging to Group I or V of the periodic table and has the characteristics of p-type semiconductor.

3. A functional deposited compound film as claimed in claim 1, wherein the doping element belonging to Group I of the periodic table is lithium.

* * * * *

UNITED STATES PATENT AND TRADEMARK OFFICE
CERTIFICATE OF CORRECTION

PATENT NO. : 4,851,302
DATED : July 25, 1989
INVENTOR(S) : KATSUMI NAKAGAWA, ET AL.                Page 1 of 3

It is certified that error appears in the above-identified patent and that said Letters Patent is hereby corrected as shown below:

IN [57] ABSTRACT

Line 7, "of" should read --or--.

COLUMN 1

Line 49, "Staebler-Wronsk," should read --Staebler-Wronsk--.
    Line 62, "forcused" should read --focused--.

COLUMN 3

Line 35, "a" (second occurrence) should read --an--.

COLUMN 4

Line 17, "inventor" should read --inventors--.

COLUMN 5

Line 11, "$SiO_2$ film" should read --$SiO_2$ film--.

COLUMN 7

Line 44, "efficiency" should read --efficiently--.

COLUMN 9

Line 29, "noted" should read --notes--.

UNITED STATES PATENT AND TRADEMARK OFFICE
CERTIFICATE OF CORRECTION

PATENT NO. : 4,851,302
DATED : July 25, 1989
INVENTOR(S) : KATSUMI NAKAGAWA, ET AL.

It is certified that error appears in the above-identified patent and that said Letters Patent is hereby corrected as shown below:

COLUMN 11

Line 25, "Tl," should read --Ti,--.

COLUMN 12

Line 5, "referably" should read --preferably--.
    Line 49, "exitation" should read --excitation--.

COLUMN 13

Line 55, "sec-butyl lithium (Li(sec-$C_4H_9$)" should read --sec-butyl lithium (Li(sec-$C_4H_9$))--.
    Line 64, "inter gas" should read --inert gas--.

COLUMN 14

Line 17, "inter gas" should read --inert gas--.
    Line 27, "5020" should read --50°--.

COLUMN 16

Line 9, "micrwwave)," should read --microwave),--.

COLUMN 17

Line 18, "H, gas" should read --$H_2$ gas--.

UNITED STATES PATENT AND TRADEMARK OFFICE
CERTIFICATE OF CORRECTION

PATENT NO. : 4,851,302
DATED : July 25, 1989
INVENTOR(S) : KATSUMI NAKAGAWA, ET AL.

Page 3 of 3

It is certified that error appears in the above-identified patent and that said Letters Patent is hereby corrected as shown below:

COLUMN 22

Line 61, "functional," should read --functional--.
Line 62, "claim 1" should read --claim 1,--.

Signed and Sealed this

Twentieth Day of November, 1990

Attest:

HARRY F. MANBECK, JR.

*Attesting Officer*  *Commissioner of Patents and Trademarks*